(12) United States Patent
Sugiyama et al.

(10) Patent No.: US 10,160,012 B2
(45) Date of Patent: Dec. 25, 2018

(54) CUP AND SUBSTRATE PROCESSING APPARATUS

(71) Applicants: Minoru Sugiyama, Kyoto (JP); Hiroshi Yoshii, Kyoto (JP); Kazuo Morioka, Kyoto (JP)

(72) Inventors: Minoru Sugiyama, Kyoto (JP); Hiroshi Yoshii, Kyoto (JP); Kazuo Morioka, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 761 days.

(21) Appl. No.: 13/671,069

(22) Filed: Nov. 7, 2012

(65) Prior Publication Data

US 2013/0133708 A1    May 30, 2013

(30) Foreign Application Priority Data

Nov. 30, 2011    (JP) .................................. 2011-262718

(51) Int. Cl.
   *B08B 3/04*       (2006.01)
   *H01L 21/67*      (2006.01)

(52) U.S. Cl.
   CPC ............ *B08B 3/04* (2013.01); *H01L 21/6715* (2013.01); *Y10T 137/6851* (2015.04)

(58) Field of Classification Search
   CPC . B08B 3/04; H01L 21/6715; H01L 21/68728; Y10T 137/6851; Y10S 134/902
   USPC .............. 134/137, 157; 156/345.11; 137/343
   See application file for complete search history.

(56) References Cited

U.S. PATENT DOCUMENTS

| | | | |
|---|---|---|---|
| 5,762,709 A * | 6/1998 | Sugimoto et al. | 118/52 |
| 6,251,487 B1 | 6/2001 | Yonaha | 427/425 |
| 6,589,338 B1 * | 7/2003 | Nakamori | H01L 21/67051 118/50 |
| 6,596,082 B2 * | 7/2003 | Chuang | H01L 21/6715 118/320 |
| 2001/0005639 A1 | 6/2001 | Yonaha | 438/782 |

(Continued)

FOREIGN PATENT DOCUMENTS

| | | |
|---|---|---|
| JP | 57-078636 | 5/1982 |
| JP | 63-229168 | 9/1988 |

(Continued)

OTHER PUBLICATIONS

Notice of Reasons for Refusal (Office Action) dated Mar. 17, 2015 issued in corresponding JP 2011-262718.

*Primary Examiner* — Rita P Adhlakha
(74) *Attorney, Agent, or Firm* — Ostrolenk Faber LLP

(57) ABSTRACT

A cup intermediate portion and a cup lower portion surround a substrate. The cup intermediate portion is arranged above an upper surface of the cup lower portion. A sidewall surrounds the cup intermediate portion and the cup lower portion. A spacing between the upper surface of the cup lower portion and a lower surface of the cup intermediate portion gradually decreases outward from an outer peripheral portion of the substrate while a clearance is formed between the lower surface of the cup intermediate portion and the upper surface of the cup lower portion in respective outer peripheral portions of the cup intermediate portion and the cup lower portion. An inner peripheral surface of the sidewall is spaced apart from the clearance outside the clearance and surrounds the clearance.

11 Claims, 5 Drawing Sheets

(56) References Cited

U.S. PATENT DOCUMENTS

| | | |
|---|---|---|
| 2001/0037858 A1 | 11/2001 | Taniyama et al. ............. 156/345 |
| 2007/0240824 A1* | 10/2007 | Kaneko et al. .......... 156/345.11 |
| 2011/0135820 A1 | 6/2011 | Imamura et al. ............. 427/240 |

FOREIGN PATENT DOCUMENTS

| | | |
|---|---|---|
| JP | 01-308026 | 12/1989 |
| JP | 01-308026 A | 12/1989 |
| JP | 7-171476 | 7/1995 |
| JP | 09-045750 A | 2/1997 |
| JP | 9-225376 | 9/1997 |
| JP | 11-040484 | 2/1999 |
| JP | 11-244765 | 9/1999 |
| JP | 11-342359 | 12/1999 |
| JP | 2000-082647 | 3/2000 |
| JP | 2001-319849 A | 11/2001 |
| JP | 2003-047903 | 2/2003 |
| JP | 2003-142398 A | 5/2003 |
| JP | 2011-119597 | 6/2011 |

* cited by examiner

CUP AND SUBSTRATE PROCESSING APPARATUS

BACKGROUND OF THE INVENTION (1) Field of the Invention

The present invention relates to a cup and a substrate processing apparatus including the same.

(2) Description of Related Art

Rotary substrate processing apparatuses have been used to subject semiconductor wafers and substrates such as glass substrates for liquid crystal display devices, glass substrates for photomasks, and glass substrates for optical disks to processing using processing liquids such as development liquids, washing liquids, rinse liquids, or photoresist liquids.

In the rotary substrate processing apparatuses, spin holders horizontally support the substrates. The spin holders rotate the substrates while the processing liquids are dropped on the centers of upper surfaces of the substrates. Thus, the substrates are processed using the processing liquids. In such a substrate processing apparatus, a cup surrounds a spin holder to prevent a part of a processing liquid from scattering to a peripheral portion of the substrate with a centrifugal force generated when the substrate rotates (e.g., JP 9-225376 A, JP 11-40484 A, and JP 2011-119597 A).

In the substrate processing apparatus discussed in each of JP 9-225376 A, JP 11-40484 A, and JP 2011-119597 A, the processing liquid in the form of a liquid or a mist, which has been rebounded from an inner surface of the cup, may adhere to the substrate depending on a processing condition. Thus, a processing defect may occur in the substrate.

BRIEF SUMMARY OF THE INVENTION

An object of the present invention is to provide a cup and a substrate processing apparatus capable of sufficiently receiving a processing liquid, which has scattered outward from a substrate, while being capable of preventing the received processing liquid from rebounding to the substrate.

(1) According to an aspect of the present invention, a cup surrounding a substrate held in a substantially horizontal posture when the substrate is processed using a processing liquid includes a first member having an upper surface surrounding the substrate, a second member having a lower surface arranged above the upper surface of the first member to surround the substrate, and a third member surrounding the first and second members, in which a spacing between the upper surface of the first member and the lower surface of the second member gradually decreases outward from an outer peripheral portion of the substrate while a clearance is formed between the upper surface of the first member and the lower surface of the second member in respective outer peripheral portions of the first and second members, and the third member has an inner surface spaced apart from the clearance outside the clearance and surrounding the clearance.

In the cup, the first and second members surround the substrate. The second member is arranged above the upper surface of the first member. The third member surrounds the first and second members. The spacing between the upper surface of the first member and the lower surface of the second member gradually decreases outward from the outer peripheral portion of the substrate while the clearance is formed between the upper surface of the first member and the lower surface of the second member in the outer peripheral portions of the first and second members. The inner surface of the third member is spaced apart from the clearance outside the clearance and surrounds the clearance.

In this case, the spacing between the upper surface of the first member and the lower surface of the second member is the largest at a position closest to the substrate. Therefore, the processing liquid, which has scattered outward from the substrate, is collected between the upper surface of the first member and the lower surface of the second member. The collected processing liquid is collected in the clearance between the outer peripheral portions of the first and second members by being guided outward along the upper surface of the first member and the lower surface of the second member, to pass through the clearance. The processing liquid, which has passed through the clearance, is received in the inner surface of the third member. The inner surface of the third member is spaced apart from the clearance. Thus, the processing liquid, which has rebounded from the inner surface of the third member, is pushed back by the flow of the processing liquid, which passes through the clearance outward. Thus, the processing liquid, which has passed through the clearance outward once, is prevented from passing through the clearance again and returning to a space between the upper surface of the first member and the lower surface of the second member.

The clearance formed between the upper surface on the side of the outer peripheral portion of the first member and the lower surface on the side of the outer peripheral portion of the second member is narrower than the spacing between the upper surface on the side of an inner peripheral portion of the first member and the lower surface on the side of an inner peripheral portion of the second member. Thus, the processing liquid, which has rebounded from the inner surface of the third member, is more reliably prevented from passing through the clearance again and returning to the space between the upper surface of the first member and the lower surface of the second member.

These results enable the processing liquid, which has scattered outward from the substrate, to be sufficiently received in the cup while being capable of preventing the processing liquid, which has been received in the cup, from rebounding to the substrate.

(2) The inner surface of the third member may extend from below a lower end of the clearance to above an upper end of the clearance.

In this case, even when the processing liquid, which has passed through the clearance between the outer peripheral portions of the first and second members, expands, the processing liquid can be reliably received in the inner surface of the third member.

(3) The cup may further include a closing member that closes a gap between the second member and the inner surface of the third member above the clearance.

In this case, even when the processing liquid, which has passed through the clearance between the outer peripheral portions of the first and second members, has floated up between the inner surface of the third member and the outer peripheral portions of the first and second members, the processing liquid is received in the closing member. Thus, a mist of the processing liquid, which has floated up between the inner surface of the third member and the outer peripheral portions of the first and second members, can be sufficiently prevented from diffusing to outside of the cup through the gap between the second member and the inner surface of the third member.

(4) A gap through which a downflow can pass may be formed between the outer peripheral portion of the second member and the inner surface of the third member.

In this case, even when the processing liquid, which has passed through the clearance between the outer peripheral portions of the first and second members, has floated up between the inner surface of the third member and the outer peripheral portions of the first and second members, the processing liquid is pushed back downward by the downflow. Thus, the mist of the processing liquid, which has floated up between the inner surface of the third member and the outer peripheral portions of the first and second members, can be sufficiently prevented from diffusing to outside of the cup through the gap between the second member and the inner surface of the third member.

(5) The upper surface of the first member, the lower surface of the second member, the clearance, and the inner surface of the third member may have a shape rotationally symmetric about a common axis. In this case, the cup can be provided in the rotary substrate processing apparatus.

If the substrate is processed using the processing liquid while being rotated, the processing liquid, which has scattered in all directions from the substrate, can be reliably received in the cup while the processing liquid, which has been received in the cup, can be reliably prevented from rebounding to the substrate.

(6) The lower surface of the second member may be inclined outward and downward diagonally to an upper surface of the substrate.

In this case, the processing liquid, which has adhered to the lower surface of the second member, is guided to the clearance between the outer peripheral portions of the first and second members along the lower surface by gravity. Thus, the processing liquid, which has scattered outward from the substrate, can easily pass through the clearance between the upper surface of the first member and the lower surface of the second member.

(7) The lower surface of the second member may form an angle of not less than 5 degrees nor more than 20 degrees with the upper surface of the substrate.

In this case, the processing liquid, which has scattered outward from the substrate, can be more reliably passed through the clearance between the upper surface of the first member and the lower surface of the second member while the processing liquid, which has hit against the lower surface of the second member, can be reliably prevented from rebounding to the substrate.

(8) At least a region, on the side of the inner peripheral portion of the upper surface, of the first member may be inclined outward and upward diagonally to an upper surface of the substrate.

In this case, the processing liquid, which has scattered outward from the substrate, can be easily collected between the upper surface of the first member and the lower surface of the second member.

(9) The upper surface of the first member may form an angle of not less than 5 degrees nor more than 20 degrees with the upper surface of the substrate.

In this case, the processing liquid, which has scattered outward from the substrate, can be reliably passed through the clearance between the upper surface of the first member and the lower surface of the second member while being capable of reliably preventing the processing liquid, which has hit against the upper surface of the first member, from rebounding to the substrate.

(10) According to another aspect of the present invention, a substrate processing apparatus that processes a substrate includes a spin holder that holds and rotates the substrate in a substantially horizontal posture, a processing liquid supply system that supplies a processing liquid onto the substrate held by the spin holder, and the cup surrounding the substrate held by the spin holder.

In the substrate processing apparatus, the spin holder holds and rotates the substrate in the horizontal posture. The processing liquid supply system supplies the processing liquid onto the substrate. The processing liquid, which has scattered outward from the substrate due to the rotation of the substrate, is collected between the upper surface of the first member and the lower surface of the second member in the cup. The collected processing liquid is collected in the clearance between the outer peripheral portions of the first and second members by being guided outward along the upper surface of the first member and the lower surface of the second member, to pass through the clearance. The processing liquid, which passes through the clearance, is received in the inner surface of the third member. The inner surface of the third member is spaced apart from the clearance. Thus, the processing liquid, which has rebounded from the inner surface of the third member, is pushed back by the flow of the processing liquid, which passes through the clearance outward. This prevents the processing liquid, which has passed through the clearance outward once, from passing through the clearance again and returning to a space between the upper surface of the first member and the lower surface of the second member.

The clearance formed between the upper surface on the side of the outer peripheral portion of the first member and the lower surface on the side of the outer peripheral portion of the second member is narrower than the spacing between the upper surface on the side of the inner peripheral portion of the first member and the lower surface on the side of the inner peripheral portion of the second member. This more reliably prevents the processing liquid, which has rebounded from the inner surface of the third member, from passing through the clearance again and returning to the space between the upper surface of the first member and the lower surface of the second member.

These results enable the processing liquid, which has scattered outward from the substrate, to be sufficiently received in the cup while being capable of preventing the processing liquid, which has been received in the cup, from rebounding to the substrate.

(11) The viscosity of the processing liquid may be 10 cP or less. In this case, the processing liquid can reliably pass through the clearance between the upper surface of the first member and the lower surface of the second member in the cup.

Other features, elements, characteristics, and advantages of the present invention will become more apparent from the following description of preferred embodiments of the present invention with reference to the attached drawings.

DESCRIPTION OF THE PREFERRED EMBODIMENTS

[1] First Embodiment (1) Substrate Processing Apparatus

Figure 1:
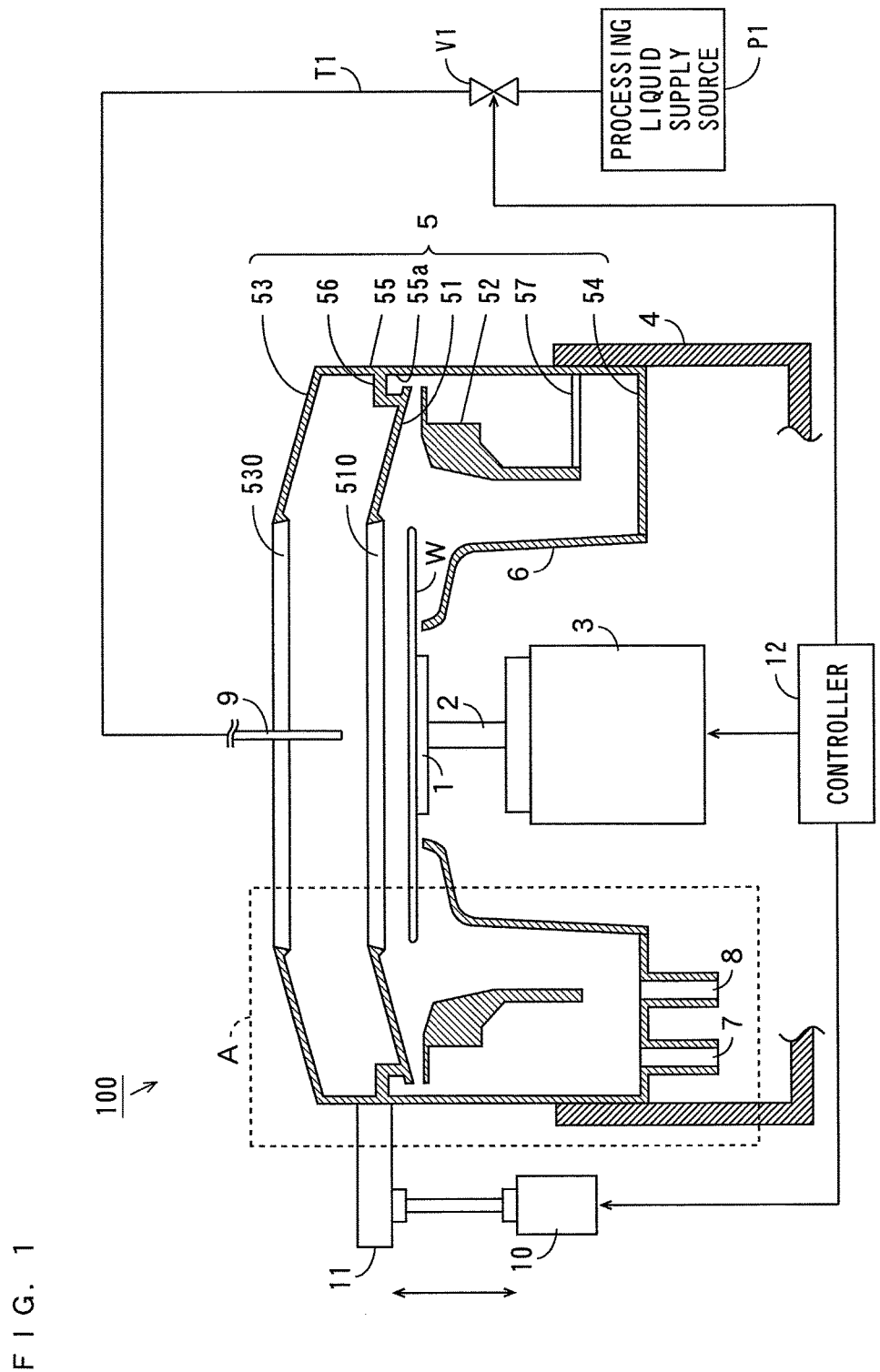
FIG. 1 is a schematic sectional view of a rotary substrate processing apparatus including a cup according to a first embodiment.

FIG. 1 is a schematic sectional view of a rotary substrate processing apparatus including a cup according to a first embodiment. As illustrated in FIG. 1, a substrate processing apparatus 100 includes a spin holder 1 that holds and rotates a substrate W in a horizontal posture. The spin holder 1 is attached to a tip end of a rotation shaft 2 of a motor 3, and is driven to rotate around a vertical axis.

A cup supporting member 4 and a cup for splash guarding 5 surround the substrate W held in the spin holder 1. The cup supporting member 4 and the cup 5 have a shape rotationally symmetric about the rotation shaft 2. The cup 5 is supported movably up and down by the cup supporting member 4. A cylinder 10 is connected to the cup 5 via a supporting frame 11. The cup 5 moves in a vertical direction by an operation of the cylinder 10.

The cup 5 includes a cup intermediate portion 51, a cup lower portion 52, a cup upper portion 53, a cup bottom portion 54, a sidewall 55, a support 56 and a plurality of supports 57. Each of the cup intermediate portion 51, the cup lower portion 52, the cup upper portion 53, the cup bottom portion 54, and the support 56 has a substantially annular shape. The cup intermediate portion 51 surrounds an upper space of the substrate W. The cup upper portion 53 surrounds the upper space of the substrate W and is positioned above the cup intermediate portion 51. Circular openings 510 and 530 are respectively formed at the center of the cup intermediate portion 51 and the center of the cup upper portion 53. The cup lower portion 52 surrounds a lower space of the substrate W. The cup bottom portion 54 surrounds the lower space of the substrate W and is positioned below the cup lower portion 52.

The sidewall 55 has a cylindrical shape, and surrounds the cup intermediate portion 51, the cup lower portion 52, the cup upper portion 53, and the cup bottom portion 54. An outer peripheral portion of the cup upper portion 53 is integrally fixed to an upper end of the sidewall 55. An outer peripheral portion of the cup bottom portion 54 is integrally fixed to a lower end of the sidewall 55. The support 56 integrally fixes the cup intermediate portion 51 to an inner peripheral surface 55a of the sidewall 55. The plurality of stick-shaped support 57 integrally fixes a lower end of the cup lower portion 52 to the inner peripheral surface 55a of the sidewall 55.

In the present embodiment, the support 56 connects the inner peripheral surface 55a of the sidewall 55 and the vicinity of the outer peripheral portion on the upper surface of the cup intermediate portion 51 over the whole periphery of the sidewall 55. Thus, the support 56 closes a gap between the outer peripheral portion of the cup intermediate portion 51 and the inner peripheral surface 55a of the sidewall 55 above the gap. On the other hand, the plurality of supports 57 connect the inner peripheral surface 55a of the sidewall 55 and the lower end of the cup lower portion 52 at a predetermined spacing (e.g., a spacing of 90 degrees). Thus, a plurality of openings are formed in a part of an area between the cup lower portion 52 and the inner peripheral surface 55a of the sidewall 55.

The cup bottom portion 54 includes a waste port 7 and an exhaust port 8. The waste port 7 is connected to waste facilities in a factory. The exhaust port 8 is connected to exhaust facilities in the factory. A current plate 6 surrounds the rotation shaft 2 and the motor 3 below the spin holder 1. The current plate 6 is fixed to an inner peripheral portion of the cup bottom portion 54. The current plate 6 has a surface inclined diagonally downward toward the outer peripheral portion of the cup bottom portion 54.

A processing liquid nozzle 9, which discharges a processing liquid onto the substrate W, is movable up and down and movable between a position above the substrate W and a waiting position outside the cup 5. In the present embodiment, the processing liquid is a development liquid, for example. The processing liquid may be a washing liquid or a rinse liquid (e.g., pure water), may be a chemical liquid for forming an antireflection film on the substrate W, or may be a resist liquid having a low viscosity. While the processing liquid preferably has a low viscosity (e.g., 10 cP or less), the present invention is not limited to this.

The processing liquid nozzle 9 is connected to a processing liquid supply source P1 via a processing liquid supply tube T1. A valve V1 is inserted into the processing liquid supply tube T1. The valve V1 is opened so that the processing liquid is supplied to the processing liquid nozzle 9 from the processing liquid supply source P1 through the processing liquid supply tube T1.

The spin holder 1 holds the substrate W in a horizontal posture with its surface to be processed directed upward. In this state, the spin holder 1 rotates the substrate W while the processing liquid is discharged into the center of the surface to be processed of the substrate W from the processing liquid nozzle 9. Thus, the processing liquid, which has been discharged to the center of the surface to be processed of the substrate W, is expanded to the whole of the surface to be processed of the substrate W with a centrifugal force caused by the rotation of the substrate W.

The substrate processing apparatus 100 includes a controller 12. The controller 12 controls the rotational speed of the motor 3. Thus, the rotational speed of the substrate W held by the spin holder 1 is controlled. The controller 12 controls opening and closing of the valve V1. Thus, timing at which the processing liquid is discharged is controlled. Further, the controller 12 controls the cylinder 10. Thus, a position in a vertical direction of the cup 5 is controlled.

(2) Detailed Configuration of Cup

Figure 2:
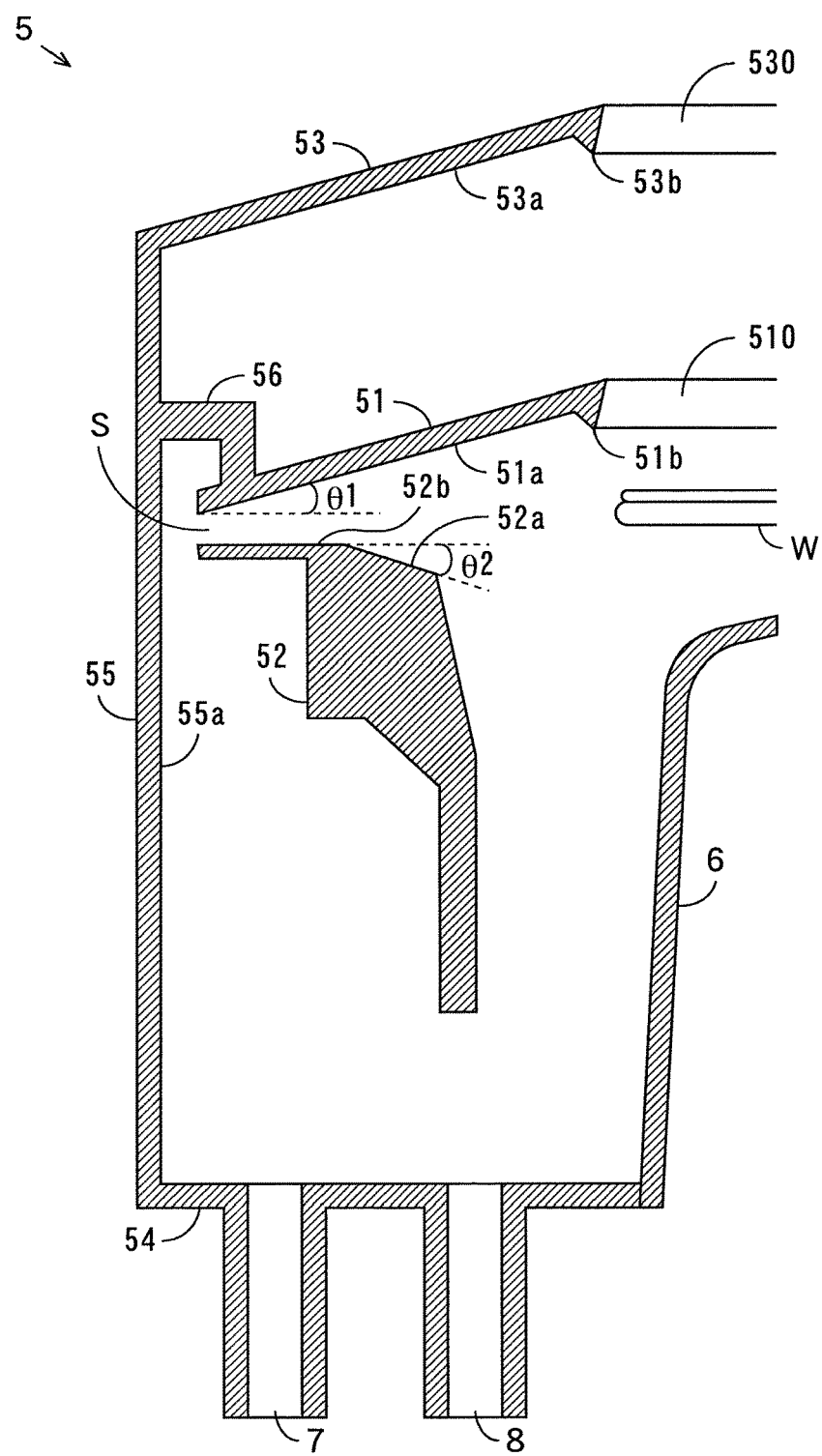
FIG. 2 is an enlarged sectional view of a portion A of the cup illustrated in FIG. 1 with a substrate stopped.

FIG. 2 is an enlarged sectional view of a portion A of the cup 5 illustrated in FIG. 1 with the substrate W stopped.

As illustrated in FIG. 2, the cup intermediate portion 51 has an annular lower surface 51a inclined diagonally downward toward the outer peripheral portion thereof. The lower surface 51a of the cup intermediate portion 51 is inclined to a horizontal plane at an inclination angle of $\theta 2$. In the present embodiment, the inclination angle $\theta 2$ is not less than 5 degrees nor more than 20 degrees, for example. A projection edge 51b projecting downward is formed in an inner peripheral portion of the cup intermediate portion 51.

The cup upper portion 53 has an annular lower surface 53a inclined diagonally downward toward the outer peripheral portion thereof. A projection edge 53b projecting downward is formed in an inner peripheral portion of the cup upper portion 53.

The cup lower portion 52 has an annular upper surface 52a inclined diagonally upward toward the outer peripheral portion thereof on the side of an inner peripheral portion thereof and an upper surface 52b horizontally extending outside the upper surface 52a. The upper surface 52a of the cup lower portion 52 is inclined to a horizontal plane at an inclination angle θ2. In the present embodiment, the inclination angle θ2 is not less than 5 degrees nor more 20 degrees, for example.

A spacing between the lower surface 51a of the cup intermediate portion 51 and the upper surfaces 52a and 52b of the cup lower portion 52 gradually decreases outward from an outer peripheral portion of the substrate W. An annular clearance S is formed between the lower surface 51a of the cup intermediate portion 51 and the upper surface 52b of the cup lower portion 52 in the outer peripheral portions of the cup intermediate portion 51 and the cup lower portion 52. The cup intermediate portion 51 and the cup lower portion 52 may be independently movable in the vertical direction, respectively. In this case, the length in the vertical direction of the clearance S can be adjusted. The length in the vertical direction of the clearance S is 1 mm to 5 mm, for example, and is 2 mm in the present embodiment.

The sidewall 55 has the inner peripheral surface 55a surrounding the outer peripheral portions of the cup intermediate portion 51 and the cup lower portion 52. The inner peripheral surface 55a is spaced apart from the clearance S, and is opposed to the clearance S.

(3) Effects

Figure 3:
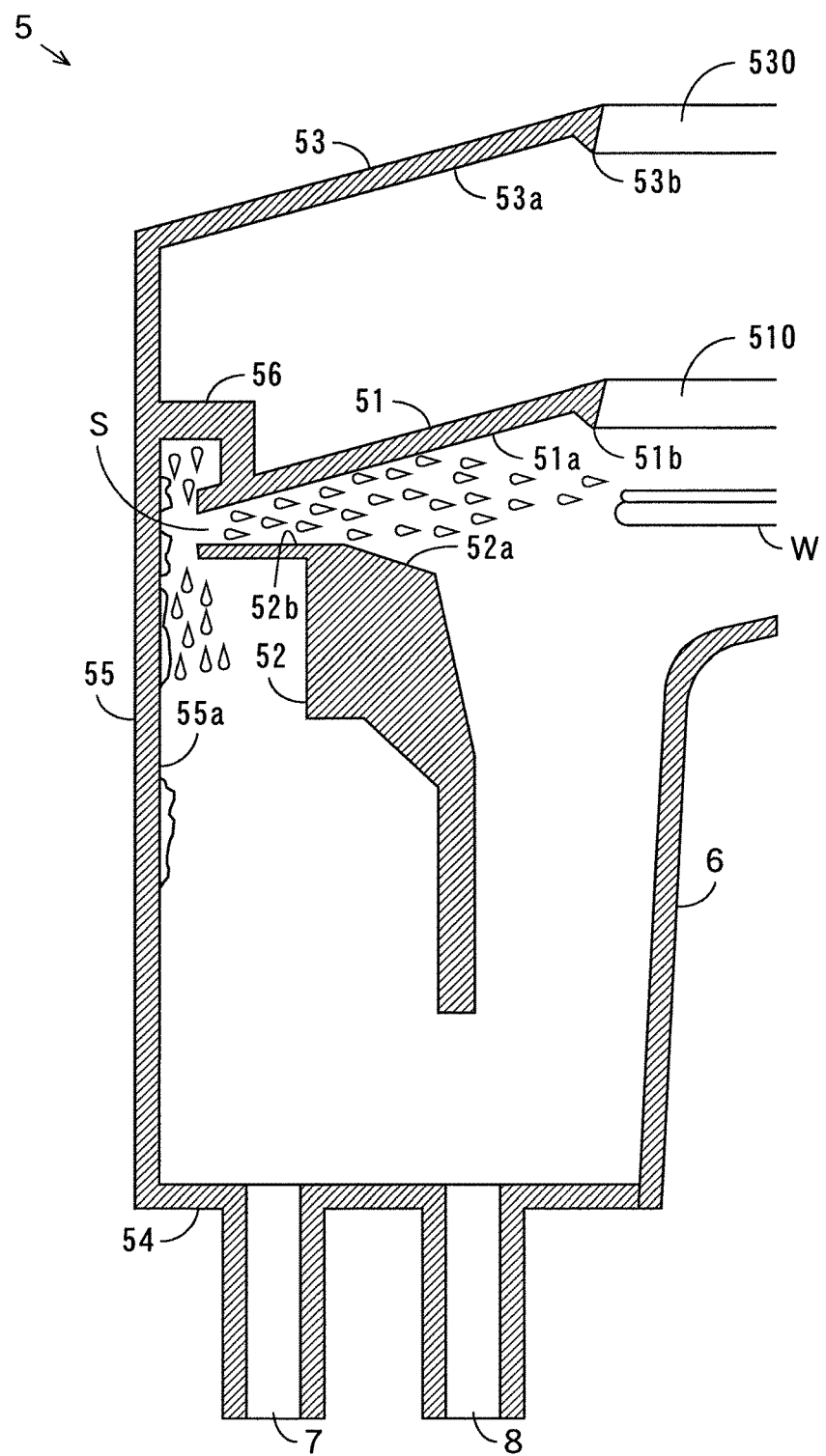
FIG. 3 is an enlarged sectional view of a portion A of the cup illustrated in FIG. 1 with a substrate rotating.

FIG. 3 is an enlarged sectional view of the portion A of the cup 5 illustrated in FIG. 1 with the substrate W rotating. As illustrated in FIG. 3, the substrate W is rotated so that the processing liquid scatters outward from the outer peripheral portion of the substrate W with a range in the vertical direction from the surface to be processed (the upper surface) of the substrate W. A spacing between the lower surface 51a of the cup intermediate portion 51 and the upper surface 52a of the cup lower portion 52 is the largest at a position closest to the substrate W. Thus, the processing liquid, which has scattered outward from the outer peripheral portion of the substrate W, is reliably collected between the lower surface 51a of the cup intermediate portion 51 and the upper surfaces 52a and 52b of the cup lower portion 52.

The collected processing liquid is collected in the clearance S between the outer peripheral portions of the cup intermediate portion 51 and the cup lower portion 52 by being guided outward along the lower surface 51a of the cup intermediate portion 51 and the upper surfaces 52a and 52b of the cup lower portion 52, to pass through the clearance S. The processing liquid, which has passed through the clearance S, is received in the inner peripheral surface 55a of the sidewall 55. The processing liquid, which has rebounded toward the clearance S on the inner peripheral surface 55a of the sidewall 55, is pushed back by the flow of the processing liquid, which passes through the clearance S outward. This prevents the processing liquid, which has passed through the clearance S outward once, from passing through the clearance S again and returning to a space between the lower surface 51a of the cup intermediate portion 51 and the upper surfaces 52a and 52b of the cup lower portion 52. The processing liquid, which has been pushed back, falls on the cup bottom portion 54 by gravity, and is discharged through the waste port 7.

The clearance S is narrower than a spacing between the upper surfaces 52a and 52b on the side of the inner peripheral portion of the cup lower portion 52 and the lower surface 51a on the side of the inner peripheral portion of the cup intermediate portion 51. Thus, the processing liquid, which has rebounded from the inner peripheral surface 55a of the sidewall 55, is reliably prevented from passing through the clearance S again and returning to the space between the upper surfaces 52a and 52b of the cup lower portion 52 and the lower surface 51a of the cup intermediate portion 51.

These results enable the processing liquid, which has scattered outward from the substrate W, to be sufficiently received by the cup 5 while being capable of preventing the processing liquid, which has been received by the cup 5, from rebounding to the substrate W.

The processing liquid, which has adhered to the inner peripheral surface 55a of the sidewall 55, falls on the cup bottom portion 54 by gravity, and is discharged through the waste port 7.

Even when the processing liquid has expanded upward and floated up on the inner peripheral surface 55a of the sidewall 55, the support 56 receives the processing liquid. The processing liquid, which has been received by the support 56, falls on the cup bottom portion 54 by gravity, and is discharged through the waste port 7. This reliably prevents a mist of the processing liquid, which has expanded upward or floated up on the inner peripheral surface 55a of the sidewall 55, from diffusing to outside of the cup 5 through a gap between the outer peripheral portions of the cup intermediate portion 51 and the cup lower portion 52 and the inner peripheral surface 55a of the sidewall 55 and through the opening 530 in the cup upper portion 53.

Therefore, the substrate processing apparatus 100 is prevented from being contaminated with the mist of the processing liquid. Even when another substrate processing apparatus is arranged adjacent to the substrate processing apparatus 100, a processing defect is prevented from occurring in a substrate W in the other substrate processing apparatus by the mist of the processing liquid used in the substrate processing apparatus 100.

The processing liquid, which has adhered to the lower surface 51a of the cup intermediate portion 51, is guided to the outer peripheral portion of the cup 5 along the inclined lower surface 51a. The processing liquid, which has adhered to the upper surface 52a of the cup lower portion 52, is guided to the outer peripheral portion of the cup 5 along the inclined upper surface 52a and upper surface 52b.

The lower surface 51a of the cup intermediate portion 51 is inclined outward and downward diagonally to the horizontal plane. The upper surface 52a of the cup lower portion 52 is inclined outward and upward diagonally to the horizontal plane. Thus, the processing liquid, which has diffused outward from the substrate W, can be easily collected between the upper surfaces 52a and 52b of the cup lower portion 52 and the lower surface 51a of the cup intermediate portion 51.

If the lower surface 51a of the cup intermediate portion 51 is inclined at an angle of not less than 5 degrees nor more than 20 degrees to the horizontal plane, the processing liquid, which has scattered outward from the substrate W, can be more reliably passed through the clearance S between the lower surface 51a of the cup intermediate portion 51 and the upper surfaces 52a and 52b of the cup lower portion 52 while the processing liquid, which has hit against the lower surface 51a of the cup intermediate portion 51, can be reliably prevented from rebounding to the substrate W.

If the upper surface 52a of the cup lower portion 52 is inclined to the horizontal plane at an angle of not less than 5 degrees nor more than 20 degrees, the processing liquid, which has scattered outward from the substrate W, can be reliably passed through the clearance S between the lower surface 51a of the cup intermediate portion 51 and the upper surfaces 52a and 52b of the cup lower portion 52 while the processing liquid, which has hit against the upper surface 52a of the cup lower portion 52, can be reliably prevented from rebounding to the substrate W.

[2] Second Embodiment

Figure 4:
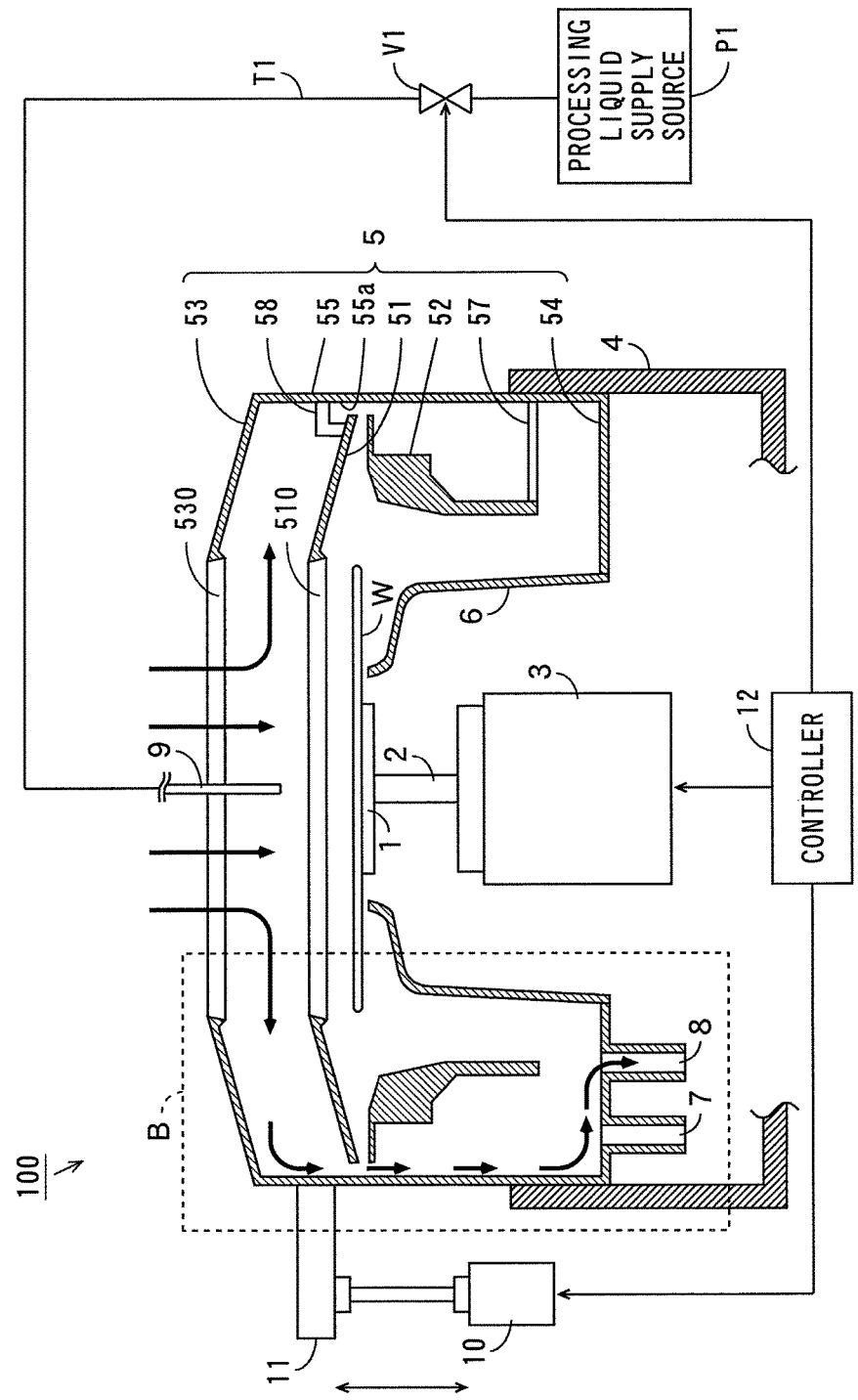
FIG. 4 is a schematic sectional view of a rotary substrate processing apparatus including a cup according to a second embodiment.

A cup according to a second embodiment will be described by referring to differences from the cup 5 according to the first embodiment. FIG. 4 is a schematic sectional view of a rotary substrate processing apparatus including a cup 5 according to the second embodiment.

As illustrated in FIG. 4, the cup 5 according to the present embodiment includes a plurality of supports 58 instead of the support 56 illustrated in FIG. 1. The plurality of supports 58 connect an inner peripheral surface 55a of a sidewall 55 and an outer peripheral portion of a cup intermediate portion 51 at a predetermined spacing (e.g., a spacing of 90 degrees). Thus, a plurality of gaps, through which a downflow can pass, are formed between the cup intermediate portion 51 and the inner peripheral surface 55a of the sidewall 55.

In the present embodiment, a distance illustrated in FIG. 4 between the outer peripheral portion of the cup intermediate portion 51 and the inner peripheral surface 55a of the sidewall 55 may be set larger than a distance illustrated in FIG. 1 between the outer peripheral portion of the cup intermediate portion 51 and the inner peripheral surface 55a of the sidewall 55. Similarly, a distance illustrated in FIG. 4 between an outer peripheral portion of a cup lower portion 52 and the inner peripheral surface 55a of the sidewall 55 may be set larger than a distance illustrated in FIG. 1 between the outer peripheral portion of the cup lower portion 52 and the inner peripheral surface 55a of the sidewall 55. Thus, a downflow can sufficiently pass between the outer peripheral portion of the cup intermediate portion 51 and the inner peripheral surface 55a of the sidewall 55.

In the present embodiment, air, which has flown in from an opening 530 above a cup upper portion 53, flows out from an exhaust port 8 in a cup bottom portion 54 after passing through an area between the cup upper portion 53 and the cup intermediate portion 51, an area between the cup intermediate portion 51 and the sidewall 55, and an area between the cup lower portion 52 and the sidewall 55 in this order, as indicated by an arrow illustrated in FIG. 4.

Figure 5:
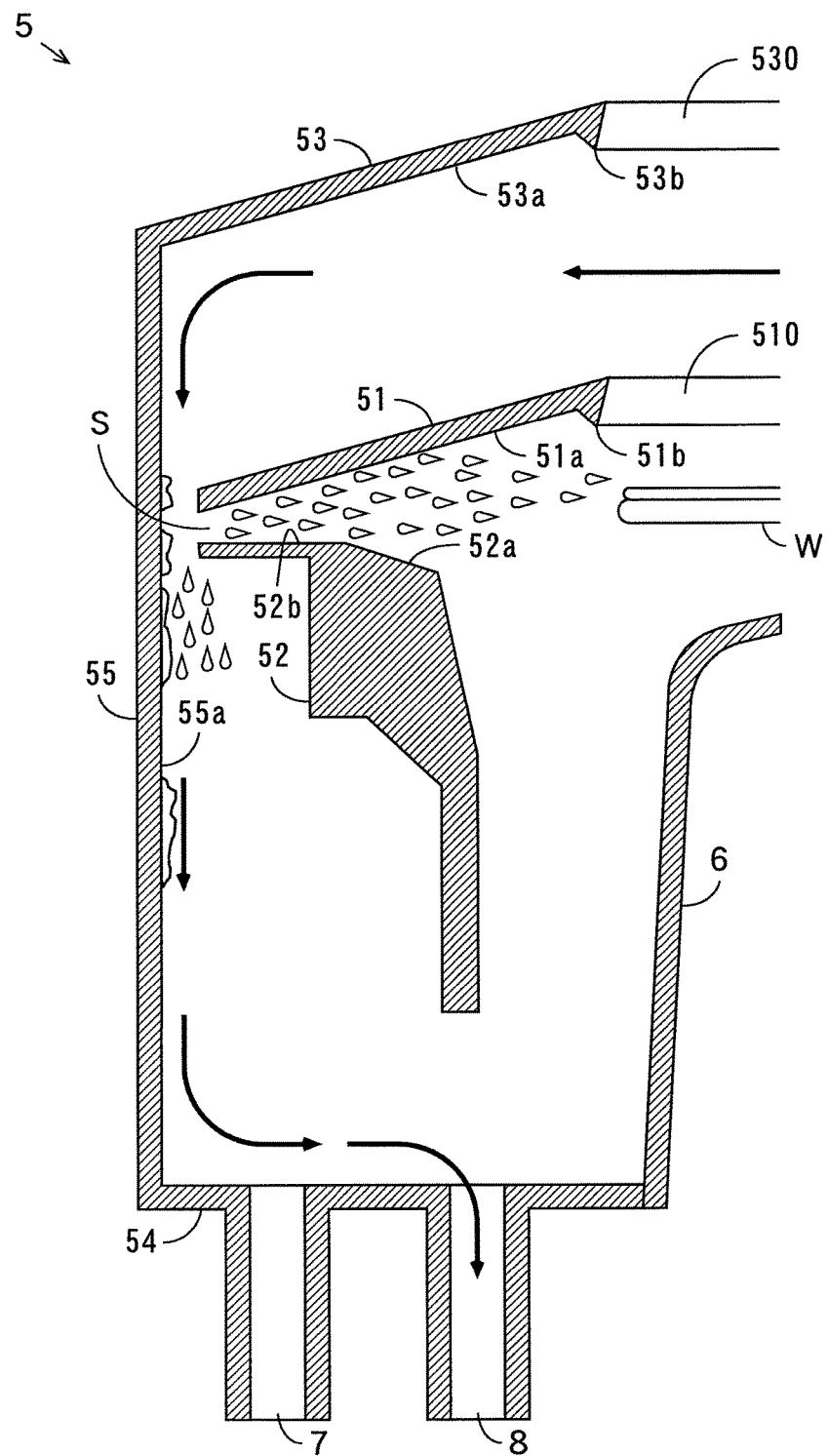
FIG. 5 is an enlarged sectional view of a portion B of the cup illustrated in FIG. 4 with a substrate rotating.

FIG. 5 is an enlarged sectional view of a portion B of the cup 5 illustrated in FIG. 4 with a substrate W rotating. The substrate W is rotated so that a processing liquid scatters outward from an outer peripheral portion of the substrate W with a range in a vertical direction from a surface to be processed (an upper surface) of the substrate W, like in the substrate processing apparatus 100 according to the first embodiment. The processing liquid, which has scattered outward from the outer peripheral portion of the substrate W, is reliably collected between a lower surface 51a of the cup intermediate portion 51 and upper surfaces 52a and 52b of the cup lower portion 52.

The collected processing liquid is collected in a clearance S between the outer peripheral portions of the cup intermediate portion 51 and the cup lower portion 52 by being guided outward along the lower surface 51a of the cup intermediate portion 51 and the upper surfaces 52a and 52b of the cup lower portion 52, to pass through the clearance S. The processing liquid, which has passed through the clearance S, is received in the inner peripheral surface 55a of the sidewall 55. Thus, in the present embodiment, the processing liquid, which has scattered outward from the substrate W, can be sufficiently received in the cup 5 while the processing liquid, which has been received in the cup 5, can be prevented from rebounding to the substrate W, like in the first embodiment.

In the present embodiment, the downflow passes between the cup intermediate portion 51 and the sidewall 55 and between the cup lower portion 52 and the sidewall 55, as indicated by an arrow illustrated in FIG. 5. Even when the processing liquid has expanded upward or floated up on the inner peripheral surface 55a of the sidewall 55, therefore, the processing liquid is pushed back by the downflow. The processing liquid, which has been pushed back downward by the downflow, together with the downflow, falls by gravity, and is discharged through a waste port 7. Thus, a mist of the processing liquid, which has expanded upward or floated up on the inner peripheral surface 55a of the sidewall 55, is reliably prevented from diffusing to outside of the cup 5 through the clearance S between the outer peripheral portions of the cup intermediate portion 51 and the cup lower portion 52 and the inner peripheral surface 55a of the sidewall 55 and through the opening 530 in the cup upper portion 53.

[3] Other Embodiments (1) While the lower surface 51a of the cup intermediate portion 51 is inclined in a linear shape diagonally downward toward the outer peripheral portion of the cup intermediate portion 51 in the above-mentioned embodiments, the present invention is not limited to this. The lower surface 51a of the cup intermediate portion 51 may be inclined in a curved shape diagonally downward toward the outer peripheral portion. While the upper surface 52a of the cup lower portion 52 is inclined in a linear shape diagonally upward toward the outer peripheral portion of the cup lower portion 52, the present invention is not limited to this. The upper surface 52a of the cup lower portion 52 may be inclined in a curved shape diagonally upward toward the outer peripheral portion.

(2) While the upper surface 52b of the cup lower portion 52 is horizontal in the above-mentioned embodiments, the present invention is not limited to this. The upper surface 52b of the cup lower portion 52 may be inclined in a linear shape or a curved shape diagonally upward toward the outer peripheral portion of the cup lower portion 52.

(3) While each of the cup intermediate portion 51, the cup lower portion 52, the cup upper portion 53, the cup bottom portion 54, and the support 56 has a substantially annular shape in the above-mentioned embodiments, the present invention is not limited to this. Each of the cup intermediate portion 51, the cup lower portion 52, the cup upper portion 53, the cup bottom portion 54, and the support 56 may have another shape such as a polygonal shape or an elliptical shape.

(4) While the cup 5 includes the cup upper portion 53 in the above-mentioned embodiments, the present invention is not limited to this. The cup 5 need not include the cup upper portion 53. While the cup intermediate portion 51 is provided with the projection edge 51b, the present invention is not limited to this. The cup intermediate portion 51 need not be provided with the projection edge 51b.

[4] Correspondences Between Elements in the Claims and Parts in Embodiments

In the following paragraphs, non-limiting examples of correspondences between various elements recited in the claims below and those described above with respect to various preferred embodiments of the present invention are explained.

In the embodiments, described above, the substrate W is an example of a substrate, the cup 5 is an example of a cup, the cup lower portion 52 is an example of a first member, and the upper surfaces 52a and 52b are examples of an upper surface. The cup intermediate portion 51 is an example of a second member, the lower surface 51a is an example of a lower surface, the sidewall 55 is an example of a third member, the inner peripheral surface 55a is an example of an inner surface, the clearance S is an example of a clearance, and the support 56 is an example of a closing member. The substrate processing apparatus 100 is an example of a substrate processing apparatus, the spin holder 1 is an example of a spin holder, and the processing liquid nozzle 9 is an example of a processing liquid supply system.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A cup for surrounding a substrate held in a substantially horizontal posture when the substrate is processed using a processing liquid, comprising:
   a first member having an upper surface facing upward surrounding said substrate;
   a second member having a lower surface facing downward arranged above said upper surface of said first member to surround said substrate; and
   a third member surrounding said first and second members,
   wherein a spacing between said upper surface of said first member and said lower surface of said second member gradually decreases outward from an outer peripheral portion of said substrate while a clearance is formed between said upper surface of said first member and said lower surface of said second member in respective outer peripheral portions of said first and second members,
   a distance between an innermost edge of said upper surface of said first member and a center of the substrate is larger than a distance between an innermost edge of said lower surface of said second member and the center of the substrate as viewed in a side view taken parallel to the substrate,
   the innermost edge of the upper surface of the first member is a portion of the upper surface closest to the center of the substrate as viewed in said side view,
   the innermost edge of the lower surface of the second member is a portion of the lower surface closest to the center of the substrate as viewed in said side view, and
   said third member has an inner surface spaced apart from said clearance outside said clearance and surrounding said clearance.

2. The cup according to claim 1, wherein said inner surface of said third member extends from below a lower end of said clearance to above an upper end of said clearance.

3. The cup according to claim 1, further comprising a closing member that closes a gap between said second member and said inner surface of said third member above said clearance.

4. The cup according to claim 1, wherein a gap through which a downflow can pass is formed between the outer peripheral portion of said second member and said inner surface of said third member.

5. The cup according to claim 1, wherein said upper surface of said first member, said lower surface of said second member, said clearance, and said inner surface of said third member have a shape rotationally symmetric about a common axis.

6. The cup according to claim 1, wherein said lower surface of said second member is inclined outward and downward diagonally to an upper surface of said substrate.

7. The cup according to claim 6, wherein said lower surface of said second member forms an angle of not less than 5 degrees nor more than 20 degrees with the upper surface of said substrate.

8. The cup according to claim 1, wherein at least a region, on the side of an inner peripheral portion of said upper surface, of said first member is inclined outward and upward diagonally to an upper surface of said substrate.

9. The cup according to claim 8, wherein said upper surface of said first member forms an angle of not less than 5 degrees nor more than 20 degrees with the upper surface of said substrate.

10. A substrate processing apparatus that processes a substrate, comprising:
    a spin holder that holds and rotates the substrate in said substantially horizontal posture;
    a processing liquid supply system that supplies a processing liquid onto the substrate held by said spin holder; and
    the cup according to claim 1, surrounding the substrate held by said spin holder.

11. The substrate processing apparatus according to claim 10, wherein the viscosity of said processing liquid is 10 cP or less.

* * * * *